United States Patent
Emmert et al.

(10) Patent No.: US 7,274,109 B2
(45) Date of Patent: Sep. 25, 2007

(54) MODULAR BONDING PAD STRUCTURE AND METHOD

(75) Inventors: James R. Emmert, Corvallis, OR (US); Charles Evans, Corvallis, OR (US); Michael Alvin Rencher, Corvallis, OR (US); Haoran Duan, Corvallis, OR (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 87 days.

(21) Appl. No.: 11/234,003

(22) Filed: Sep. 23, 2005

(65) Prior Publication Data

US 2007/0069392 A1 Mar. 29, 2007

(51) Int. Cl.
*H01L 23/48* (2006.01)
(52) U.S. Cl. ............... 257/786; 257/692; 257/698; 257/E23.02; 257/E23.07; 257/E23.152

(58) Field of Classification Search .............. 257/692, 257/698, 786, E23.015, E23.02, E23.019, 257/E23.043, E23.046, E23.07, E23.152, 257/E23.153, E23.168, E23.175
See application file for complete search history.

(56) References Cited

U.S. PATENT DOCUMENTS 6,489,688 B1* 12/2002 Baumann et al. ........... 257/786

* cited by examiner

*Primary Examiner*—George R. Fourson
*Assistant Examiner*—Julio Maldonado

(57) ABSTRACT

A semiconductor die includes a plurality of drivers and a plurality of bonding pads. Each driver is formed by a plurality of interconnected modules and has an associated bonding pad to which at least one of the modules of the driver is electrically connected. The modules of some of the drivers are positioned outside of the associated bonding pad toward a periphery of the die. The bonding pads may be arranged, for example, in a double- or triple-staggered pattern around the periphery of the die.

15 Claims, 6 Drawing Sheets

MODULAR BONDING PAD STRUCTURE AND METHOD

TECHNICAL FIELD

The present invention relates generally to integrated circuits and more specifically to the interconnection of a semiconductor die to an associated carrier or package.

BACKGROUND OF THE INVENTION

Numerous types of electronic devices are common place and are utilized by people for a variety of functions in their everyday life. At the heart of many of these devices are integrated circuits or chips that contain electronic circuitry designed to perform a required function. For example, many modern electronic devices include a microprocessor or a digital signal processor, both of which are examples of integrated circuits or chips. A chip includes a semiconductor die in which the electronic circuitry is formed. The semiconductor die is physically mounted to a package including a number of electrical leads. In addition to being physically mounted to the package, the electronic circuitry in the semiconductor die is electrically coupled to the electrical leads of the package. The electronic circuitry formed on the semiconductor die may in this way be coupled through the package and electrical leads to the electronic circuitry of another chip.

To interconnect the semiconductor die to the electrical leads of the associated package, bonding pads are formed on a surface of the semiconductor die. The actual interconnection between each bonding pad and a corresponding electrical lead may be done in different ways. For example, in some chips each bonding pad and a corresponding electrical lead are interconnected through a very fine gold or aluminum bonding wire. Although other interconnection methods exist, such as flip-chip bonding, interconnection through a bonding wire will be assumed in the present description merely for ease of explanation. The bonding pads are typically metallic and provide a point for electrically coupling a portion of the electronic circuitry formed in the semiconductor die to the electrical leads of the package. Thus, each bonding pad may be viewed as providing an input to or an output from the electronic circuitry in the semiconductor die. As a result, associated with each bonding pad is a driver that includes electronic circuitry which functions to either receive an input signal applied to the bonding pad and provide that signal to other circuitry on the semiconductor die or to apply an output signal on the bonding pad in response to signals from other circuitry on the semiconductor die.

The bonding pads along with their associated drivers are typically located around a periphery of the semiconductor die to simplify the electrical interconnection between each bonding pad and the associated electrical lead. FIG. 1 is a simplified top view of the conventional formation of drivers D1-D3 and the associated bonding pads BP1-BP3 on a semiconductor die. Only the three drivers D1-D3 and the associated bonding pads BP1-BP3 are shown merely for ease of description, and there would actually be many more drivers and bonding pads formed on a typical semiconductor die. Because the electronic circuitry forming each of the drivers D1-D3 must be electrically coupled to the corresponding bonding pad BP1-BP3, the drivers are physically located near the bonding pads. In the following description, when utilizing reference descriptors such as D1-D3 and BP1-BP3 that include both letters and numbers, the number may be omitted when referring to any or all of the components associated with the reference descriptors, meaning the drivers and bonding pads in this situation. Only when referring to a specific one of the components will both the letters and numbers typically be utilized. The same is true of other reference descriptors utilized below with reference to other figures of the present application.

Each of the bonding pads BP has a width W1 in the example of FIG. 1. The width W1 of the bonding pads BP must have some minimum value to allow for reliable connection of the bonding wire to the bonding pad that provides electrical interconnection to the corresponding lead on the package. As the electronic circuitry formed in semiconductor dies becomes more sophisticated, more electrical interconnections to the circuitry are required and thus more bonding pads BP must be formed on each semiconductor die. For example, electronic circuitry formed on the semiconductor die typically includes a data bus and a width of this data bus is ever increasing to allow more bits of data to be transferred over the bus at a time, thus increasing the throughput of data transfer. Each additional bit being added to the data bus requires a corresponding bonding pad BP, and therefore as the width of the data bus increases more bonding pads are required.

Simply adding more bonding pads BP and associated drivers D is not a straightforward option in many situations since these additional pads and drivers occupy valuable space on the semiconductor die. FIG. 2 is simplified top view of drivers D1-D3 and associated bonding pads BP1-BP3 in a double-staggered pattern on a semiconductor die to reduce the space on the semiconductor die occupied by these components. In this approach, a width DW of the drivers D is reduced relative to the width W of the drivers D in FIG. 1 and the bonding pads BP are alternately offset or "staggered." Although the width DW of the drivers D is reduced, meaning a reduced pitch between drivers, as previously mentioned the bonding pads BP must have a minimum size to allow for reliable connection of the associated bonding wire and thus the bonding pads in figure to have the same width Was the bonding pads in FIG. 1. By reducing the width DW of the drivers D and staggering the bonding pads BP, the overall area on the semiconductor die occupied by these components is reduced. This is seen by noting that in FIG. 2 to three drivers D1-D3 and associated bonding pads BP1-BP3 occupy an overall width D2 that is less than an overall width D1 occupied by the three drivers D1-D3 and associated bonding pads BP1-BP3 in FIG. 1.

With the double-stagger approach of FIG. 2, each bonding pad BP must be electrically connected to the corresponding driver D through a conductive trace 200 that is commonly referred to as a "neck." This is also true of other staggered approaches, such as a triple stagger, as will be appreciated by those skilled in the art. The necks 200 interconnecting the bonding pads BP and their associated drivers D consume valuable area on the semiconductor die that could otherwise be utilized for forming other components. Thus, while the double-stagger approach reduces the space occupied by the drivers D and bonding pads BP in a horizontal direction (i.e., D2<D1), the necks 200 necessitated by this approach result in a waste of valuable area in a vertical direction (i.e., in a direction parallel to the necks 200).

There is a need for a system and method of reducing the space on the semiconductor die occupied by bonding pads and their associated drivers.

SUMMARY OF THE INVENTION

According to one aspect of the present invention, a semiconductor die includes a plurality of drivers and a plurality of bonding pads. Each driver is formed by a plurality of interconnected modules and has an associated bonding pad to which at least one of the modules of the driver is electrically connected. The modules of some of the drivers are positioned outside of the associated bonding pad toward a periphery of the die. The bonding pads may be arranged, for example, in a double- or triple-staggered pattern around the periphery of the die.

Another aspect of the present invention is a method of forming bonding pads on a semiconductor die that has a periphery. The method includes forming a plurality of drivers on the semiconductor die, each driver including a plurality of individual driver modules. A plurality of bonding pads are formed on the semiconductor die, with at least some of the bonding pads being positioned between modules of an associated driver in an inward direction from the periphery of the die.

DETAILED DESCRIPTION OF PREFERRED EMBODIMENTS

Figure 3:
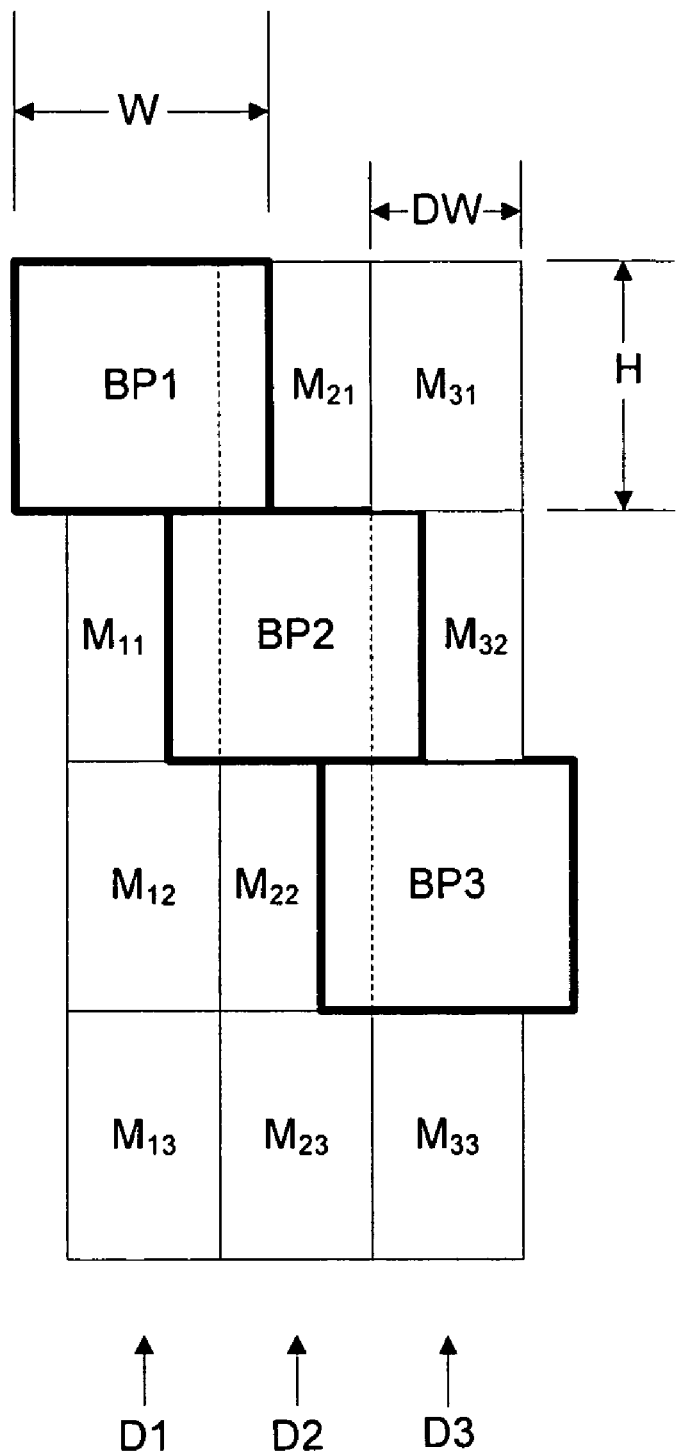
FIG. 3 is a top view of modular drivers and associated bonding pads according to one embodiment of the present invention.

FIG. 3 is a top view of modular drivers D1-D3 and associated bonding pads BP1-BP3 according to one embodiment of the present invention. Each of the modular drivers D1-D3 includes three driver modules $M_{11}$-$M_{33}$, with the driver modules being electrically interconnected to collectively form the corresponding modular driver. The electronic circuitry of each modular driver D is thus formed by interconnecting the electronic circuitry of the associated modules M. By dividing the electronic circuitry of each driver D into modules M, the bonding pad BP associated with each driver may be formed between the modules of that driver and overlying modules of adjacent drivers, which reduces the neck interconnecting the bond pad and the driver, as will be explained in more detail below. Reducing the neck interconnecting each bond pad BP and the associated driver D advantageously reduces the overall space occupied by the bond pads and drivers on the semiconductor die.

In the sample embodiment of FIG. 3, the electronic circuitry forming each of the drivers D is divided up into three modules M. The circuitry within these three modules M is then electrically interconnected (not shown) to form the corresponding driver D. For the driver D1, the corresponding modules $M_{11}$-$M_{13}$ are positioned adjoining one another in a first column as shown, with the associated bonding pad BP1 being positioned adjacent the module $M_{11}$. The bonding pad BP1 is formed in a different layer on the semiconductor die than are the modules $M_{11}$-$M_{13}$, and lies above the layer in which the modules are formed in the embodiment of FIG. 3. A width W of the bonding pad BP1 is greater than a width DW of the modules $M_{11}$-$M_{13}$, with the width of the bonding pad being determined, in part, by physical size requirements for reliably connecting the associated bonding wire (not shown) to the pad. The bonding pad BP1 is horizontally centered on the first column of modules $M_{11}$-$M_{13}$ of driver D1, and thus portions of the bonding pad extend to the left and right of modules as shown.

The modules $M_{21}$-$M_{23}$ collectively form the driver D2 and are positioned in a second column next to the modules $M_{11}$-$M_{13}$ of the driver D1. The modules $M_{22}$ and $M_{23}$ of the driver D2 are formed adjoining one another and next to the modules $M_{12}$ and $M_{13}$ of driver D1 in the first column. The module $M_{21}$ of the driver D2, however, is spaced upward apart from the module $M_{22}$ by a distance that is equal to a height H of each of the modules M. In the example embodiment of FIG. 3, the height H of each module M is the same as the width W of the bonding pads BP. The vertical height of each bonding pad BP would actually be at least slightly less than the height H of the modules M so that the bonding pads do not physically contact each other and are thus electrically isolated. In FIG. 3, the bonding pads BP1, BP2, and BP3 are electrically isolated and do not physically contact each other with the pads being drawn as shown merely to simplify the figure. The module $M_{21}$ of the driver D2 is vertically aligned with the bonding pad BP1 associated with the driver D1. For the driver D2, the associated bonding pad BP2 is positioned horizontally centered on the second column of modules $M_{21}$-$M_{23}$ and vertically positioned between the modules $M_{21}$ and $M_{22}$.

As with the bonding pad BP1, the bonding pad BP2 is formed in a different layer on the semiconductor die than are the modules M and in the same layer as the bonding pad BP1. The bonding pad BP2 thus lies above the layer in which the modules M are formed. Because the width W of the bonding pad BP2 is greater than the width DW of the modules M, a first portion of the bonding pad BP2 extends to the left over the module $M_{11}$ of the driver D1 and a second portion extends to the right over the module $M_{32}$ of the driver D3, as will be discussed in more detail below.

The modules $M_{31}$-$M_{33}$ collectively form the driver D3 and are positioned in a third column next to the modules $M_{21}$-$M_{23}$ of the driver D2. The modules $M_{31}$ and $M_{32}$ of the driver D3 are formed adjoining one another, with the module $M_{31}$ positioned next to module $M_{21}$ and module $M_{32}$ positioned next to and vertically aligned with the bonding pad BP2. The module $M_{33}$ of the driver D3 is spaced downward apart from the module $M_{32}$ by a distance that is equal to a height H of each of the modules M. The module $M_{33}$ of the driver D3 is next to and vertically aligned with the module $M_{23}$ of the driver D2. For the driver D3, the associated bonding pad BP3 is positioned horizontally centered on the third column of modules $M_{31}$-$M_{33}$ and between the modules $M_{33}$ and $M_{32}$. The bonding pad BP3 is formed in the same layer on the semiconductor die as the bonding pads BP1 and BP2 thus lies above the layer in which the modules M are formed. A first portion of the bonding pad BP3 extends to the left over the module $M_{22}$ of the driver D2 and a second portion extends to the right over a next column of modules (not shown).

Figure 4:
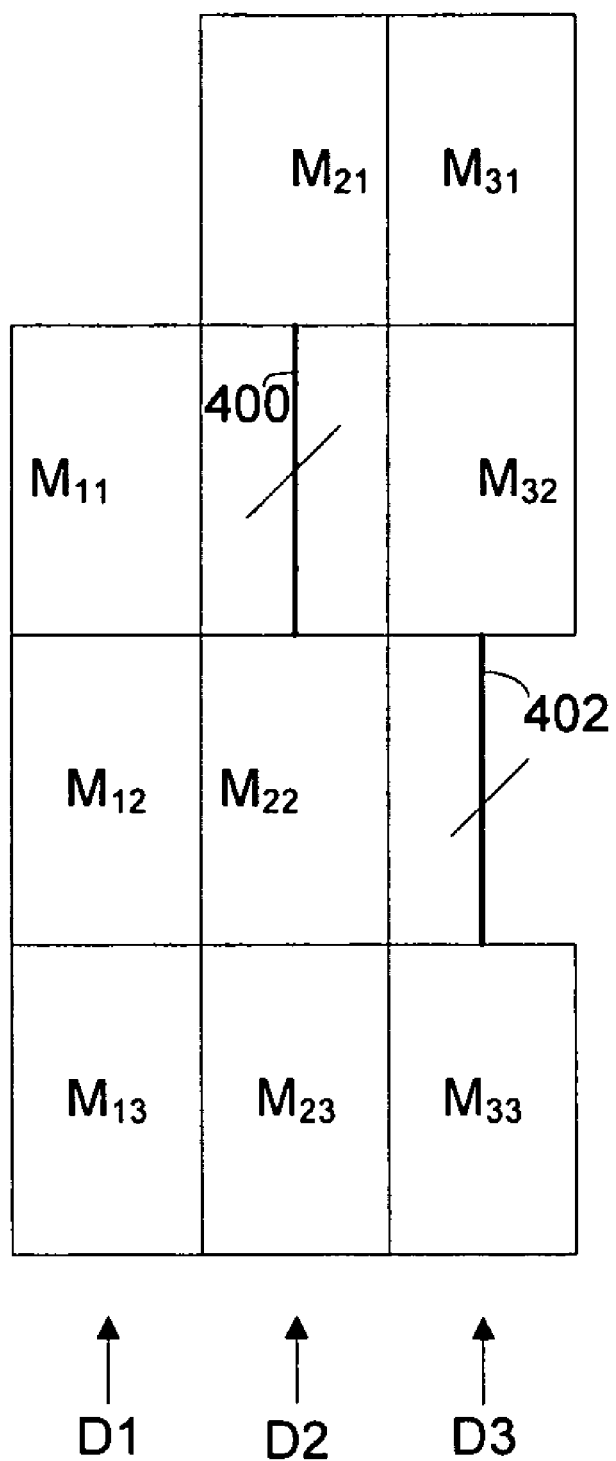
FIG. 4 is a top view of the modular drivers of FIG. 3 without the associated bonding pads to show conductive traces running under the bonding pads to interconnect the modules of each driver.

As previously mentioned, the modules $M_{11}$-$M_{13}$, $M_{21}$-$M_{23}$, and $M_{31}$-$M_{33}$ are electrically interconnected to form the drivers D1, D2, and D3, respectively. Because the associated bonding pads BP are vertically positioned between the modules M in the drivers D, conductive traces run under the associated bonding pad to electrically interconnect all the modules as required. FIG. 4 is a top view of the modular drivers D1-D3 of FIG. 3 shown without the associated bonding pads BP, which thereby show conductive traces 400 running under the bonding pad BP2 for the driver D2 and conductive traces 402 running under the bonding pad BP3 for the driver D3. In this way, the conductive traces 400 electrically interconnect the module $M_{21}$ to the modules $M_{22}$ and $M_{23}$ of the driver D2. The conductive traces 402 similarly electrically interconnect the module $M_{33}$ to the modules $M_{31}$ and $M_{32}$ of the driver D3.

The bonding pad BP2 is also coupled to the conductive traces 400 to thereby electrically interconnect this bonding pad and the driver D2. In the same way, the bonding pad BP3 is coupled to the conductive traces 402 to thereby electrically interconnect this bonding that in the driver D3. Typically, each of the bonding pads BP2 and BP3 is connected through a suitable via and conductive traces (not shown) to the corresponding conductive traces 400 and 402, respectively. A suitable via and conductive traces (not shown) also electrically couple the bonding pad BP1 to the modules $M_{11}$-$M_{13}$ of the driver D1.

Referring to FIGS. 3 and 4, each bonding pad BP has at least one portion that partially overlaps a module M of an adjacent driver D. For example, the bonding pad BP2 has a first portion extending horizontally to the left over the module $M_{11}$ and a second portion extending horizontally to the right over the module $M_{32}$. Accordingly, electronic circuitry of the module $M_{11}$ is formed partially under the bonding pad BP2 and electronic circuitry of the module $M_{32}$ is also formed partially under this bonding pad. As a result, the structure of the drivers D and bonding pads BP in the embodiment of FIGS. 3 and 4 may be referred to as a "circuit under pad" type structure. With this type of structure, the bonding pads BP and a dielectric layer (not shown) dispose between the bonding pads and the underlying modules M must be formed so that stress put on the bonding pads during the attaching of the bonding wires to these pads does not damage the underlying modules, as will be appreciated by those skilled in the art.

Figure 1:
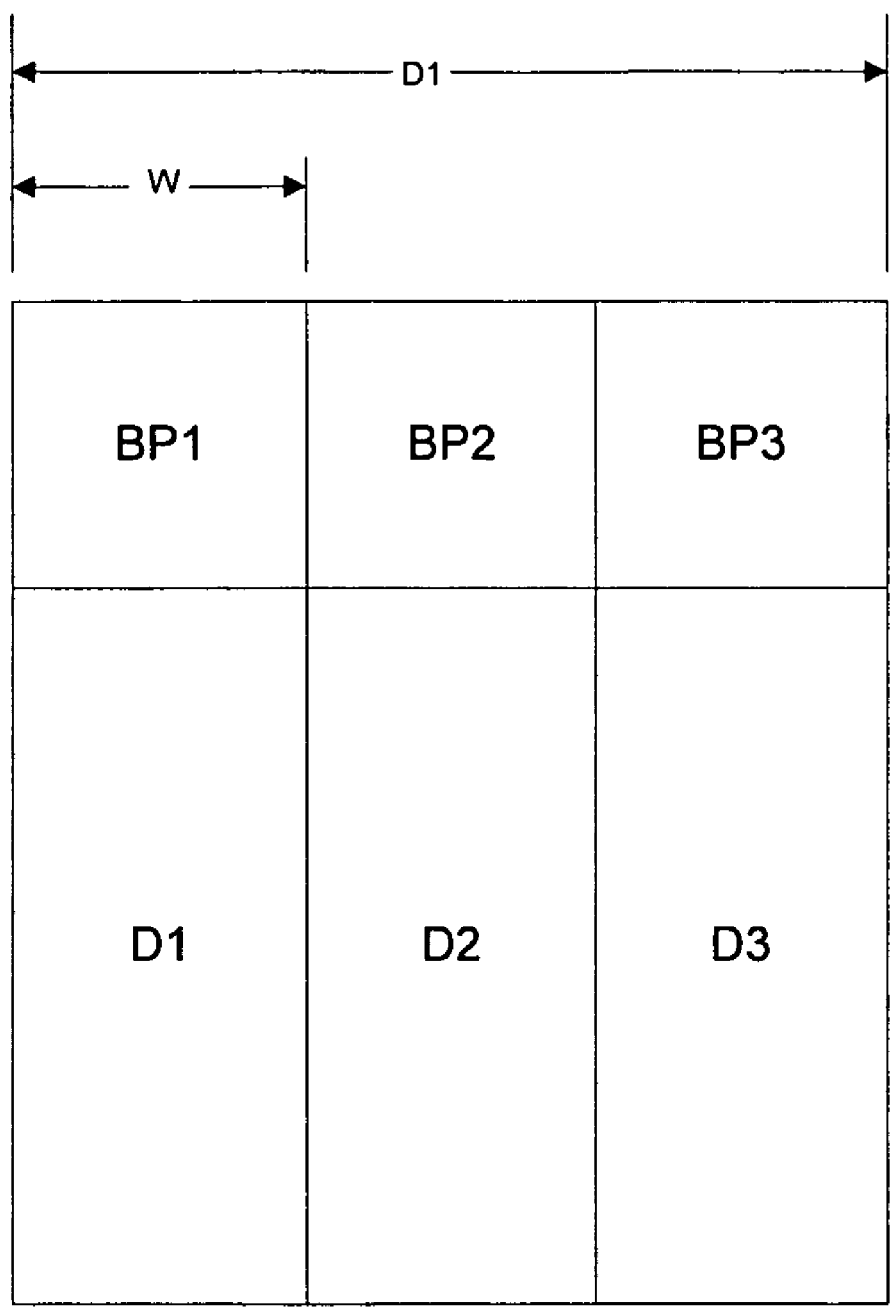
FIG. 1 is a simplified top view of the conventional formation of drivers and associated bonding pads on a semiconductor die.
Figure 2:
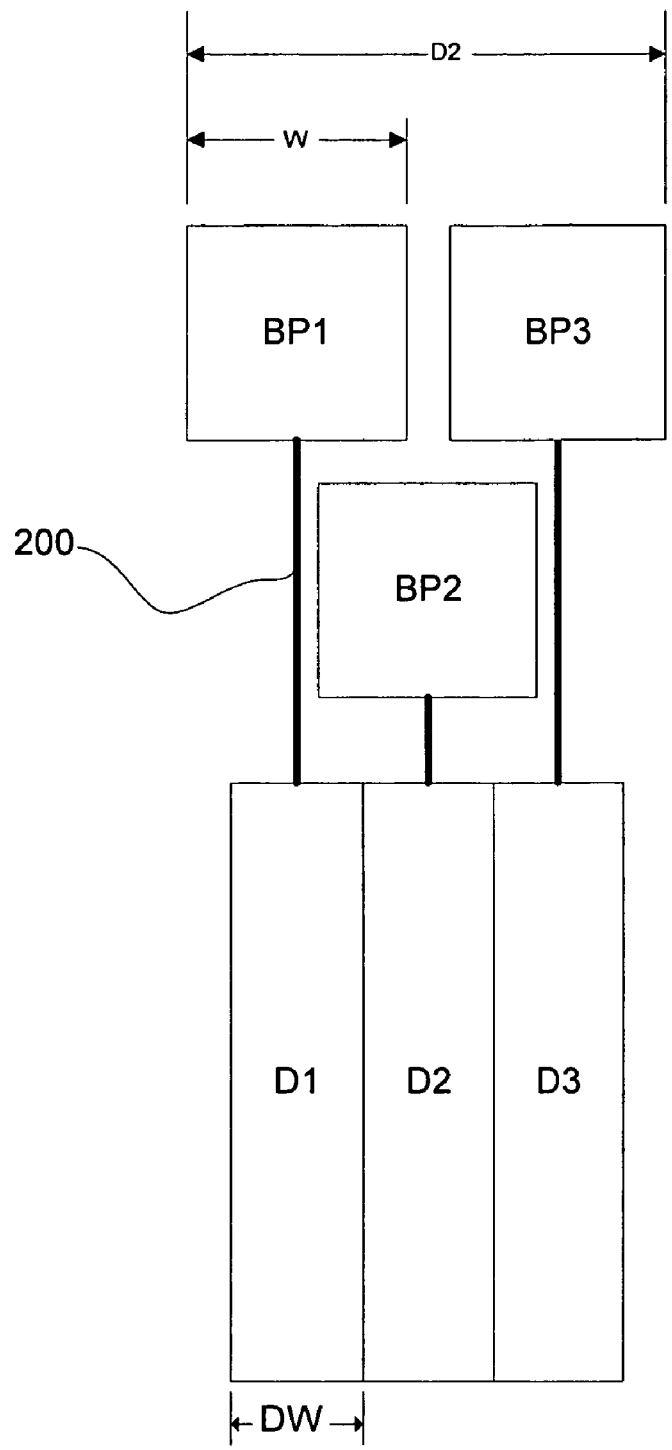
FIG. 2 is simplified top view of drivers and the conventional formation of associated bonding pads in a double-staggered pattern on a semiconductor die.

Dividing up the circuitry into a number of individual modules M for each of the drivers D enables greater flexibility in positioning of the associated bonding pads BP. This flexibility reduces the neck interconnecting the bonding pad BP and associated driver D as previously discussed with reference to FIG. 2. With the structure of FIGS. 3 and 4, the bonding pads BP may be staggered to reduce the pitch or distance between bonding pads such that more bonding pads can be formed along a given direction (the horizontal direction in FIGS. 3 and 4). Also, by positioning the bonding pads BP among the modules M of the drivers D, overall space on the substrate occupied by the drivers and pads is reduced in the vertical dimension as well. If the drivers D in FIG. 2 are assumed to be 3 H high, then in comparing FIGS. 2 and 3 the embodiment of FIG. 3 reduces the overall vertical height of the structure by about H since in the structure of FIG. 2 the length in the vertical dimension consumed by the pads BP is slightly greater than 2 H while in the structure of FIG. 3 this length is only slightly greater than H. Over the entire horizontal length of all the bonding pads BP required for the die, H times this horizontal length can amount to significant savings in area on the die with the structure of FIGS. 3 and 4. While space savings can be realized with the structure of FIGS. 3 and 4 as just described, alternatively the area occupied by the drivers D could be increased through the use of larger components to, for example, provide more drive current on a bond pad while maintaining the same overall occupied area for the drivers and pads as in the structure of FIG. 2.

Figure 5:
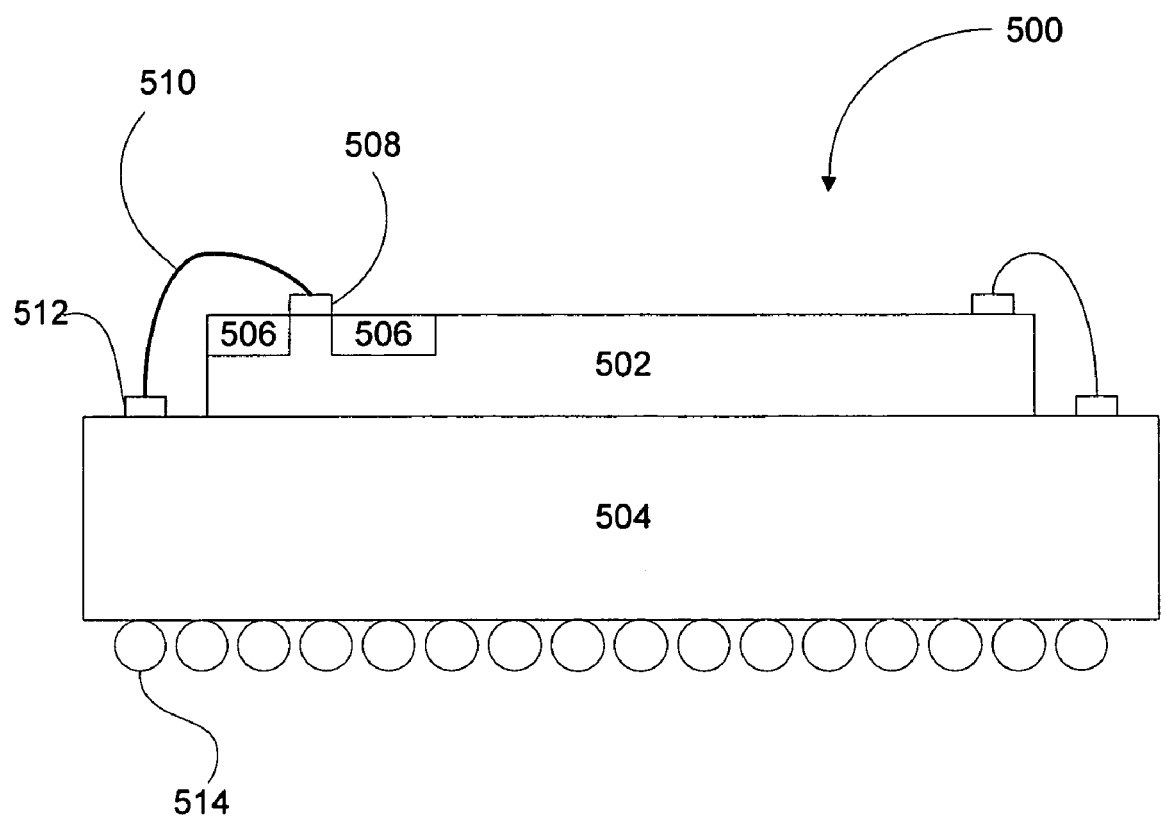
FIG. 5 is a simplified cross-sectional view of a chip including a semiconductor die containing modular drivers and bonding pads of FIG. 3 according to another embodiment of the present invention.

FIG. 5 is a simplified cross-sectional view of a chip 500 including a semiconductor die 502 coupled to package 504 and including modular drivers 506 and bonding pads 508 according to another embodiment of the present invention. In one embodiment of the chip 500, the modular drivers 506 and bonding pads 508 are the same the corresponding components in FIGS. 3 and 4. The semiconductor die 502 is physically coupled to the package 504, which may be, for example, a dual-in-line package, single-in-line package, pin grid array, or a ball grid array as shown in the example of FIG. 5. The die 502 may be physically attached to the package 504 in any suitable manner, such as through a suitable epoxy or glue. The bonding pads 508 are electrically coupled through bonding wires 510 to terminals 512 on the package 504, and each of these terminals 512 is, in turn, electrically coupled (not shown) to a corresponding electrical lead in the form of a conductive ball 514 on the package. Once the die 502 is physically attached and all bonding wires 510 are connected, the die is typically encapsulated such as with a suitable epoxy to protect the die and thereby complete the construction of the chip 500.

Figure 6:
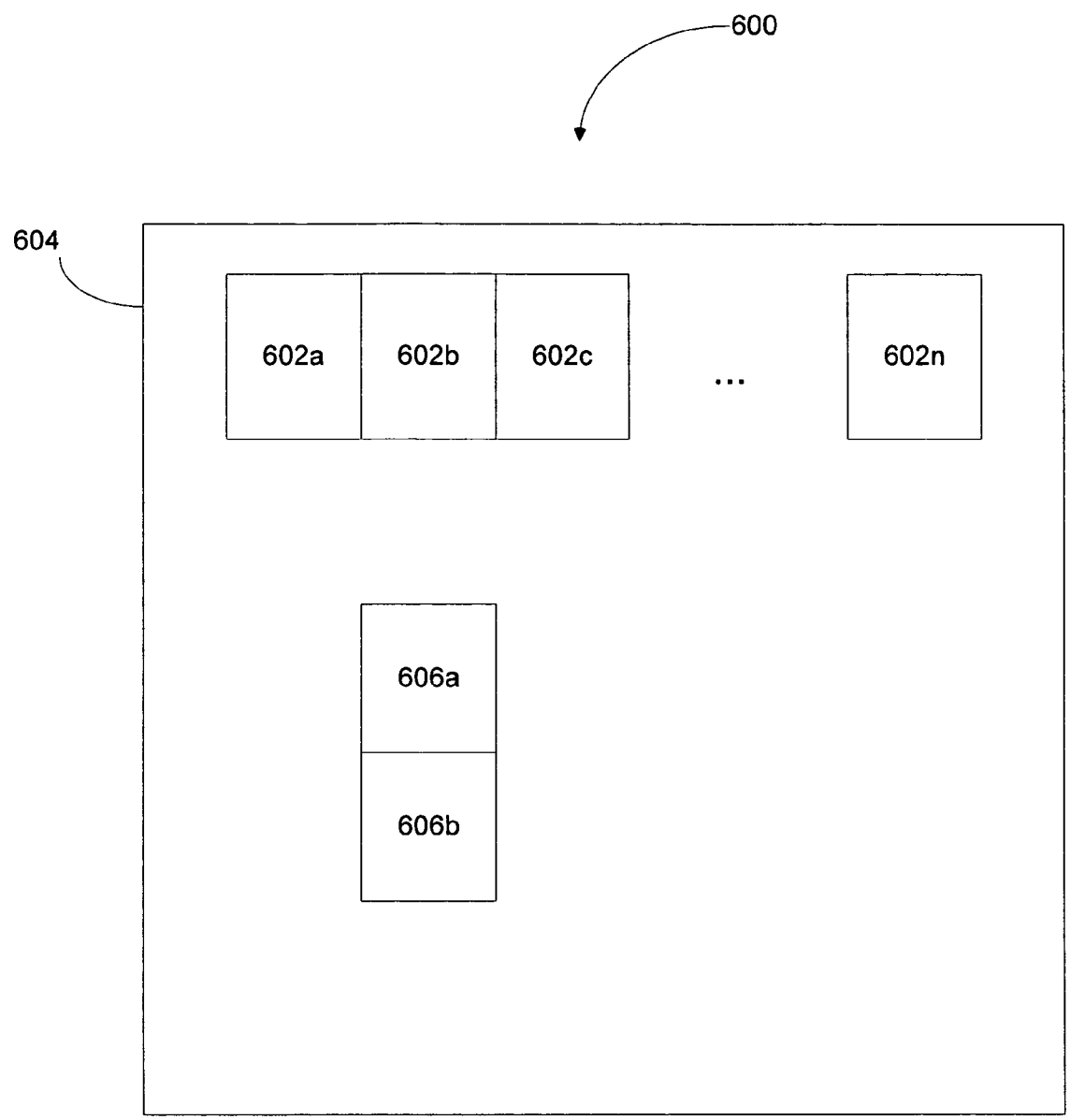
FIG. 6 is a top view of the semiconductor die of FIG. 5 illustrating the formation of modular drivers and bonding pads both around the periphery and toward a center of the die according to embodiments of the present invention.

FIG. 6 is a top view of a semiconductor die 600 illustrating the formation of the modular drivers and bonding pad structures 602a-n around a periphery 604 of the die and/or drivers and bonding pad structures 606a-b formed toward a center of the die according to embodiments of the present invention. Each of the structures 602a-n and 606a-b corresponds to structure of the drivers D and bonding pads BP of FIGS. 3 and 4. Typically, the die 600 would include only the structures 602a-n formed around the periphery 604 of the die. Although shown only along a top edge of the die 600, the structures 602a-n may be formed around the entire periphery of the die and thus along all four edges of the die in the example of FIG. 6. Only two structures 606a-b are shown in the interior of the die 600, although large numbers of such structures could advantageously be formed there as well.

In the present description, the electronic circuitry coupled to the bonding pads BP is referred to generally as the drivers D. The term driver as used herein includes any type of electronic circuitry coupled to a bonding pad BP, such as input and output drivers or buffers as previously discussed but also including any other type of circuitry like clock input or clock output buffers, buffers for receiving or providing controls, buffers for receiving address signals, electrostatic discharge circuitry, bus circuitry such as conductive traces where the corresponding bonding pad BP is a supply voltage VDD or ground GND pad, and so on. Also, the embodiment of FIGS. 3 and 4 is just one example of many different possible embodiments. The stagger of the bonding pads BP in FIG. 3 may be termed a triple-staggered pattern, and if each driver D is divided up into more than three modules, say N modules, then an N-staggered pattern may be utilized according to another embodiment. Dividing the drivers D into two modules and arranging the drivers and bonding pads BP in a double-staggered pattern is another embodiment. Columns of modules, say M1 and M2 in this case, could be arranged as bonding pad BP, M1, then M2 in a first column from top to bottom in the vertical direction, M1, BP, M2 in the next column from top to bottom in the vertical direction, BP, M1, M2 in the next column, and so on.

Even though various embodiments and advantages of the present invention have been set forth in the foregoing description, the above disclosure is illustrative only, and changes may be made in detail and yet remain within the broad principles of the present invention. One skilled in the art will also understand that the figures related to the various embodiments are not to be interpreted as conveying any specific or relative physical dimensions, and that specific or relative physical dimensions, if stated, are not to be considered limiting unless the claims expressly state otherwise. Further, illustrations of the various embodiments when presented by way of illustrative examples are intended only to further illustrate certain details of the various embodiments, and shall not be interpreted as limiting the scope of the invention. Therefore, the present invention is to be limited only by the appended claims.

What is claimed is:

1. A semiconductor die including a plurality of drivers and a plurality of bonding pads, each driver being formed by a plurally of interconnected modules and each driver having an associated bonding pad to which at least one of the modules of the driver is electrically connected, and the modules of some of the drivers being positioned outside of the associated bonding toward a periphery of the die.

2. The semiconductor die of claim 1 wherein each module has a fun width and each of the bonding pads has a second width that is greater than the first width, each bonding pad being staggered relative to adjacent bonding pads in an inward direction away front the periphery of the die and wherein each bonding has a portion dint overlaps a portion of a module oft least one adjacent circuit.

3. The semiconductor die of claim 2 wherein each bonding pad is substantially square and wherein each module has a length extending inward from the periphery of the die that is substantially equal to the second width of each bonding pad.

4. The semiconductor die of claim 2 wherein at least one of drivers comprises an input buffer, output buffer, electronic discharge circuitry, or bus circuitry.

5. The semiconductor die of claim 2 wherein around the periphery of the die the bonding pads are staggered inward in groups of two to form a double-staggered pattern and/or inward in groups of three to form a triple-staggered pattern.

6. The semiconductor die of claim 1 wherein the Modules that are positioned outside of the associated bonding toward a periphery of the die we electrically coupled to the other modules of the driver through conductive traces running under the associated bonding pad.

7. The semiconductor die of claim 1 wherein each of the drivers comprises one of an input driver or an output driver.

8. The semiconductor die of claim 1 wherein each of the bonding pads comprises copper, or aluminum, or gold.

9. An electronic chip, comprising:
a package including a plurality of electrical leads; and
a semiconductor die physically coupled to the package, the semiconductor die including a plurality of drivers and a plurality of bonding pads, each bonding pad being electrically coupled to a corresponding electrical lead of the package and each driver being formed by a plurality of interconnected modules, and each driver having an associated bonding pad to which at least one of the modules of the driver is electrically connected, and the modules of some of the drives being positioned outside of the associated bonding pad toward a periphery of the die.

10. The electronic chip of claim 9 wherein the package comprises one of a dual-in-line package, single-in-line package, pin grid array, or ball grid array.

11. The electronic chip of claim 10 wherein each bonding pad substantially square and wherein each module has a length extending inward from the periphery of the die that is substantially equal to the second width of each bonding pad.

12. The electronic chip of claim 10 wherein the bonding pads are staggered to form a triple-staggered pattern or a double-staggered pattern.

13. The electronic chip of claim 10 wherein the modules that are positioned outside of the associated bonding pad toward a periphery of the die are electrically coupled to the other modules of the driver through conductive traces running under the associated bonding pad 14. The electronic chip of claim 9 wherein the semiconductor die includes electronic circuitry that forms an image sensor.

15. The electronic chip or claim 9 wherein each module has a first width and each of the bonding pads has a second width that is greater than the first width, each bonding pad being staggered relative to adjacent bonding pads in an inward direction toward a center of the die and wherein each bonding pad has a portion that overlaps a portion of a module of at least one adjacent driver.

* * * * *

UNITED STATES PATENT AND TRADEMARK OFFICE
CERTIFICATE OF CORRECTION

| | |
|---|---|
| PATENT NO. | : 7,274,109 B2 |
| APPLICATION NO. | : 11/234003 |
| DATED | : September 25, 2007 |
| INVENTOR(S) | : James Emmert et al. |

It is certified that error appears in the above-identified patent and that said Letters Patent is hereby corrected as shown below:

Col. 7 Line 25 In Claim 1, delete "plurally" and insert -- plurality --, therefor.

Col. 7 Line 29 In Claim 1, after "bonding" insert -- pad --.

Col. 7 Line 31 In Claim 2, delete "fun" and insert -- first --, therefor.

Col. 7 Line 34 In Claim 2, delete "front" and insert -- from --, therefor.

Col. 7 Line 35 In Claim 2, after "bonding" insert -- pad --.

Col. 7 Line 35 In Claim 2, delete "dint" and insert -- that --, therefor.

Col. 7 Line 36 In Claim 2, delete "oft" and insert -- of at --, therefor.

Col. 7 Line 43 In Claim 4, delete "electronic" and insert -- electrostatic --, therefor.

Col. 7 Line 49 In Claim 6, delete "Modules" and insert -- modules --, therefor.

Col. 7 Line 50 In Claim 6, after "bonding" insert -- pad --.

Col. 8 Line 1 In Claim 6, delete "we" and insert -- are --, therefor.

Col. 8 Line 19 In Claim 9, delete "drives" and insert -- drivers --, therefor.

Col. 8 Line 27 In Claim 11, after "pad" insert -- is --.

Col. 8 Line 37 In Claim 13, after "pad" insert -- . --.

UNITED STATES PATENT AND TRADEMARK OFFICE
CERTIFICATE OF CORRECTION

PATENT NO. : 7,274,109 B2
APPLICATION NO. : 11/234003
DATED : September 25, 2007
INVENTOR(S) : James Emmert et al.

It is certified that error appears in the above-identified patent and that said Letters Patent is hereby corrected as shown below:

Col. 8 Line 42 In Claim 15, delete "or" and insert -- of --, therefor.

Signed and Sealed this

Twenty-fourth Day of February, 2009

JOHN DOLL
*Acting Director of the United States Patent and Trademark Office*